United States Patent
Kathman et al.

[11] Patent Number: 6,118,559
[45] Date of Patent: Sep. 12, 2000

[54] BROADBAND DIFFRACTIVE DIFFUSER AND ASSOCIATED METHODS

[75] Inventors: Alan D. Kathman; Eric G. Johnson; Adam S. Fedor; James E. Morris, Jr., all of Charlotte, N.C.

[73] Assignee: Digital Optics Corporation, Charlotte, N.C.

[21] Appl. No.: 09/071,762

[22] Filed: May 5, 1998

Related U.S. Application Data

[63] Continuation-in-part of application No. 08/770,524, Dec. 20, 1996, Pat. No. 5,850,300.

[51] Int. Cl.[7] .............................. G03H 1/08; G02B 5/32
[52] U.S. Cl. ........................... 359/9; 359/15; 359/566; 359/569; 359/599; 359/900
[58] Field of Search ...................... 359/9, 15, 569, 359/575, 566, 558, 599, 900

[56] References Cited

U.S. PATENT DOCUMENTS

| | | | |
|---|---|---|---|
| 3,623,786 | 11/1971 | Dammann | 359/9 |
| 4,547,037 | 10/1985 | Case | 359/15 |
| 5,075,800 | 12/1991 | Hasman et al. | 359/558 |
| 5,089,835 | 2/1992 | Kitagishi | 359/599 |
| 5,161,058 | 11/1992 | Matsui | 359/569 |
| 5,189,454 | 2/1993 | Yamazaki et al. | 359/599 |
| 5,202,775 | 4/1993 | Feldman et al. | 359/11 |
| 5,317,435 | 5/1994 | Kasazumi et al. | 359/9 |
| 5,361,149 | 11/1994 | Hasegawa et al. | 359/9 |
| 5,383,000 | 1/1995 | Michaloski et al. | 355/67 |
| 5,486,950 | 1/1996 | Collinge | 359/569 |
| 5,534,386 | 7/1996 | Petersen et al. | 359/15 |
| 5,559,724 | 9/1996 | Morrison | 359/569 |
| 5,589,982 | 12/1996 | Faklis et al. | 359/569 |
| 5,610,733 | 3/1997 | Feldman et al. | 359/9 |
| 5,630,661 | 5/1997 | Fox | 362/187 |
| 5,631,721 | 5/1997 | Stanton et al. | 359/569 |
| 5,796,499 | 8/1998 | Wenyon | 359/15 |

FOREIGN PATENT DOCUMENTS

| | | | |
|---|---|---|---|
| 0 744 664 A2 | 11/1996 | European Pat. Off. | G03F 7/20 |
| 2 716 726 | 9/1995 | France | G02B 5/32 |
| 0089806 | 7/1980 | Japan | 369/15 |

OTHER PUBLICATIONS

C.B. Burckhardt, "Use of a Random Phase Mask for the Recording of Fourier Transform Holograms of Data Masks", Applied Optics, vol. 9, No. 3, pp. 695–700, Mar. 1970.

M.P. Dames, et al., "Efficient Optical Elements to Generate Intensity Weighted Spot Arrays: Design and Fabrication", Applied Optics, vol. 30, No. 19, pp. 2685–2691, Jul. 1991.

(List continued on next page.)

*Primary Examiner*—Cassandra Spyrou
*Assistant Examiner*—John Juba, Jr.
*Attorney, Agent, or Firm*—Susan S. Morse

[57] ABSTRACT

A broadband diffractive diffuser contains at least three levels, with approximately a phase shift of $\pi$ between at least two of the at least three levels. Such a diffuser provides light with more than two phasor vectors at the zero order. The presence of the more than two phasor vectors reduces the zero order diffraction efficiency at non-design wavelength, increasing the usefulness of the diffuser at wavelengths other than the design wavelength. Preferably, the diffractive diffuser includes a plurality of regions, approximately 50% of an area of the plurality of regions presenting a phase shift of $\pi$ at a design wavelength, approximately 25% of the area of the plurality of regions presenting a phase shift of $2\pi$ at the design wavelength, and approximately 25% of the area of the plurality of regions presenting a phase shift of 0 at the design wavelength. Such a diffractive diffuser may be formed by logical operations between two diffractive diffuser patterns, by adding two diffractive diffuser patterns, or by pixel-by-pixel scanning.

11 Claims, 2 Drawing Sheets

$\lambda = \lambda_0$ $\lambda < \lambda_0$ $\lambda > \lambda_0$

OTHER PUBLICATIONS

Yoshikazu Nakayama, et al., "Diffuser with Pseudorandom Phase Sequence", J. Optical Soc. Am., vol. 69, No. 10, pp. 1367–1372, Oct. 1979.

H. Dammann, "Blazed Synthetic Phase–Only Holograms", OPTIK 31, Heft 1, pp. 95–105, 1970.

Michael R. Feldman et al., "Interative encoding of high–efficiency holograms for generation of spot arrays", May 15, 1989/vol. 14, No. 10/Optics Letters, pp. 479–481.

J. Cederquist, et al., "Computer–Generated Holograms for Geometric Transformations", Applied Optics, vol. 23, No. 18 Sep. 1984, pp. 3099–3104.

$\lambda = \lambda_0$ $\lambda < \lambda_0$ $\lambda > \lambda_0$ though the range of input wavelengths is less than when such a broadband diffractive diffuser is not employed.

BROADBAND DIFFRACTIVE DIFFUSER AND ASSOCIATED METHODS

CROSS REFERENCE TO RELATED APPLICATIONS

This application is a continuation in part of U.S. application Ser. No. 08/770,524 filed on Dec. 20, 1996 entitled "Beam Homogenizer", now U.S. Pat. No. 5,850,300, the entire contents of which are hereby incorporated by reference.

FIELD OF THE INVENTION

The present invention is directed to diffractive diffusers, in particular to broadband diffractive diffusers.

DESCRIPTION OF RELATED ART

A binary or diffractive diffuser functions well as its design wavelength, but suffers significant contributions from the zero-order as the wavelength deviates from the design wavelength. The zero-order contributions arise from that light which is not diffracted. This will lead to undesirable peaks in intensity when the design wavelength is deviated from.

A schematic view of a binary diffuser is shown in FIG. 1. In FIG. 1, a binary or diffractive diffuser 10 consists of amorphous, free-form regions roughly evenly split between regions presenting a zero phase shift and regions presenting a $\pi$ phase shift to incoming light. These regions are so labeled in FIG. 1. These regions are formed the different etching depths shown in FIG. 2. The zero regions are not etched at all, while the $\pi$ regions are etched to a depth of $d_1$, where $d_1 = \lambda_0/2(n-1)$, where $\lambda_0$ is the design wavelength and n is the index of refraction of the diffuser. Thus, at the design wavelength, the etched portions present a phase shift of $\pi$ or $\lambda_0/2$ to the incoming light.

Light at different wavelengths will interact with the diffuser 10 as shown in the phasor histograms in FIGS. 3a–3c. When an input wavelength $\lambda$ is the design wavelength $\lambda_0$, the zero order contributions from the zero regions and the $\pi$ regions cancel each other, thereby resulting in no zero order contribution, as shown in FIG. 3a. When the input wavelength $\lambda$ is less than the design wavelength, as shown in FIG. 3b, for the regions designed to present a phase shift of zero, the zero order phase shift will be the same as that for the design wavelength, i.e., zero. However, for the portions etched to the depth of $d_1$, this depth will no longer look like a phase shift of $\pi$ to the input wavelength, but rather a phase shift of greater than $\pi$. The resultant vector 12 has an amplitude of $\sin^2[(\pi/2)(\lambda_0/\lambda-1)]$. Similarly, when the input wavelength $\lambda$ is greater than the design wavelength, as shown in FIG. 3c, the portions etched to the depth of $d_1$ will present a phase shift of less than $\pi$, with a resultant vector 14 having an amplitude of $\sin^2((\pi/2)(\lambda_0/\lambda-1))$.

The shift of the phasor vector for the $\pi$ phase shift regions away from the axis where they would cancel the contribution from the zero phase shift regions reduces the efficiency of the diffuser 10 at wavelengths other than the design wavelength. For example, in the range of $\lambda=0.83 \lambda_0$ to $\lambda=1.20 \lambda_0$, the zero order diffraction efficiency will be as high as 10%, i.e., 10% of the input beam will be delivered to the zero order, severely reducing the efficiency and general usefulness of the diffuser 10.

SUMMARY OF THE PRESENT INVENTION

Therefore, it is an object of the present invention to provide a diffractive diffuser that is less sensitive to deviations from a design wavelength, i.e., a broadband diffractive diffuser.

It is further an object of the present invention to provide a diffractive diffuser having at least three discrete levels. At least two of the levels may have a phase difference of approximately $\pi$ between them.

It is further an object of the present invention to provide a broadband diffractive diffuser including a computer generated hologram designed at a wavelength $\lambda_0$ for which light of a wavelength $\lambda$ incident thereon has a total power in a zeroth order of less than $\sin^2((\pi/2)(\lambda_0/\lambda-1))$. Such a diffuser may, for $0.83\lambda_0 \leq \lambda \leq 1.20\lambda_0$, have a zeroth order be $\sin^4((\pi/2)(\lambda_0/\lambda-1))$.

It is an additional object of the present invention to provide a broadband diffractive diffuser including a computer generated hologram designed at a wavelength $\lambda_0$ for which light of a wavelength $\lambda$, $0.83\lambda_0 \leq \lambda \leq 1.20\lambda_0$, incident thereon has a zero order diffraction efficiency of less than 1%.

It is another object of the present invention to provide a diffractive diffuser including a plurality of regions, approximately 50% of an area of the plurality of regions presenting a phase shift of $\pi$ at a design wavelength, approximately 25% of the area of the plurality of regions presenting a phase shift of $2\pi$ at the design wavelength, and approximately 25% of the area of the plurality of regions presenting a phase shift of 0.

It is further an object of the present invention to provide a diffractive diffuser having a plurality of regions designed to operate at a design wavelength, while the diffractive diffuser provides light at a wavelength other than the design wavelength with more than two phasor vectors at zero order.

It is further an object of the present invention to provide a method of designing a broadband diffractive diffuser. The method includes generating a diffractive diffuser pattern at a design wavelength and modifying the diffractive diffuser pattern to provide light at a wavelength other than the design wavelength with more than two phasor vectors at zero order.

The modifying may include generating a different diffractive diffuser pattern at the design wavelength and performing a logical operation between regions of the diffractive diffuser pattern which present a zero phase shift with the different diffractive diffuser pattern. The generating of the different diffractive diffuser pattern may include rotating the diffractive diffuser pattern. The logical operation may be an AND operation.

Alternatively, the modifying may include generating a different diffractive diffuser pattern and adding phases of said different diffuser pattern to corresponding phases of the diffractive diffuser patter. This adding may include the diffractive diffuser pattern forming an undersized desired output, the different diffractive diffuser pattern forming a spot, and a modified pattern formed by adding phases of the different diffractive diffuser pattern and the diffractive diffuser pattern generating a desired output.

Alternatively, the generating may include splitting the diffuser into regions having a phase shift of $\pi$ and regions having a phase shift of zero at the design wavelength, and the modifying may include splitting regions having a phase shift of zero into regions having a phase shift of zero and regions having a phase shift of $2\pi$ at the design wavelength. At least one of the splittings may be even. At least one of the splittings may result in amorphous regions. The splittings may include a pixel-by-pixel search.

In accordance with the above objects, the plurality of regions may have an amorphous shape. The plurality of regions may be formed by a computer-generated hologram. The patterns may be formed photolithographically.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 4:
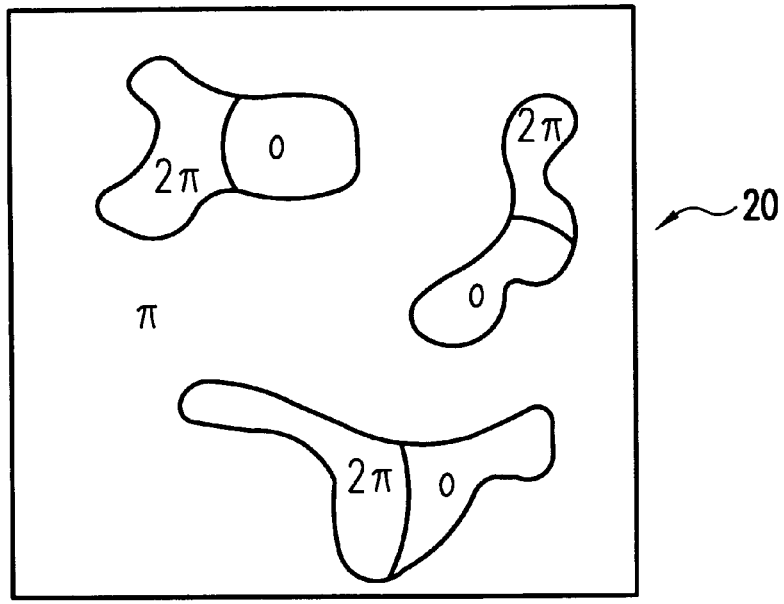
FIG. 4 is a schematic diagram of a broadband diffractive diffuse element in accordance with the present invention.

FIG. 4 is a schematic diagram of a diffractive diffuser 20 in accordance with the present invention. As can be seen therein, the zero regions have been subdivided into subsets of zero and $2\pi$. While in FIG. 4, the previously zero regions have been roughly divided in half to split between the zero and $2\pi$ regions, these regions may be subdivided in many ways as long as over entire surface approximately 50% of the surface presents a phase shift of $\pi$ to the design wavelength, approximately 25% of the surface presents a phase shift of zero to the design wavelength, and the remaining 25% of the surface presents a phase shift of $2\pi$ to the design wavelength.

Figure 5:
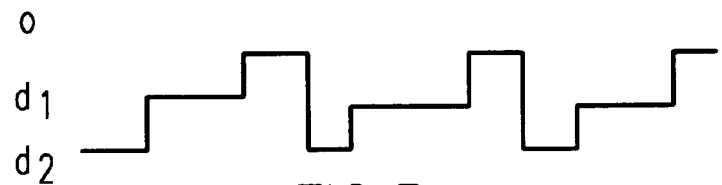
FIG. 5 illustrates the etch depths for the diffractive diffuse of FIG. 4.

The etch depths for the diffractive diffuser 20 are shown in FIG. 5. Again, $d_1 = \lambda_0/2(n-1)$ while the additional depth $d_2 = \lambda_0/(n-1)$. Thus, the design wavelength, the depth $d_2$ presents a phase shift of $2\pi$ and the depth d1 presents a phase shift of $\pi$. At the design wavelength, a phase shift of zero and a phase shift of $2\pi$ are mathematically identical. Thus, the diffractive diffuser 20 will function identically to the diffractive diffuser 10 at the design wavelength. However, the inclusion of the phase shift $2\pi$ at the design wavelength will result in a third vector of the zero order contribution for wavelengths other than the design wavelength. This third vector, when summed with the other vectors arising from the phase shift of zero and the phase shift of $\pi$, will reduce the amplitude of the resultant vector. This is shown in FIG. 6a through FIG. 6c.

Figures 3A, 3B, 3C:
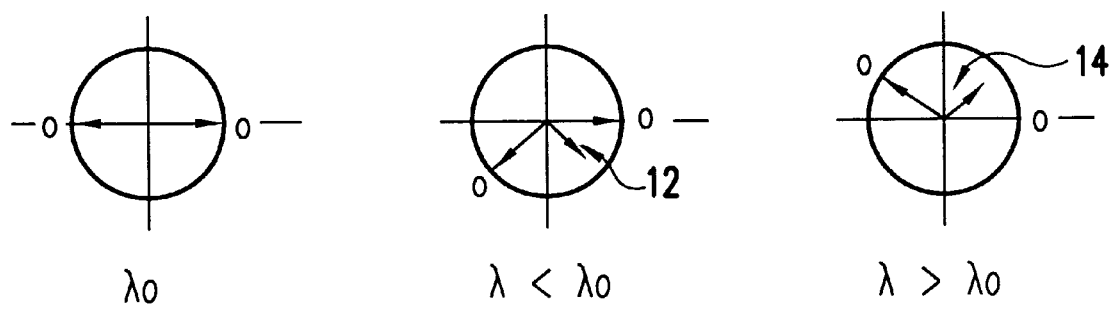
FIG. 3a is a phasor histogram of the zero order contribution for the diffractive diffuser shown in FIG. 1 at the design wavelength.
FIG. 3b is a phasor histogram of the zero order contribution for the diffractive diffuser shown in FIG. 1 for wavelengths less than the design wavelengths.
FIG. 3c is a phasor histogram of the zero order contribution for the diffractive diffuser shown in FIG. 1 for wavelengths greater than the design wavelengths.
Figure 6A:
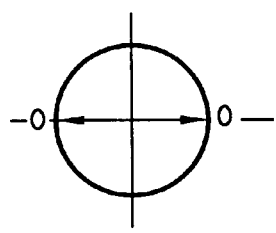
FIG. 6a is a phasor histogram of the zero order contribution for the diffractive diffuser shown in FIG. 4 at the design wavelength.
Figure 6B:
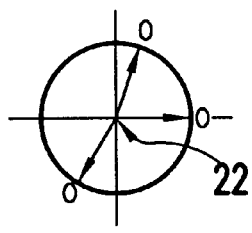
FIG. 6b is a phasor histogram of the zero order contribution for the diffractive diffuser when the input wavelength is less than the design wavelength.
Figure 6C:
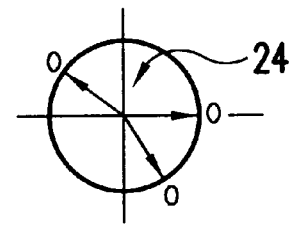
FIG. 6c is a phasor histogram of the zero order contribution for the diffractive diffuser shown in FIG. 4 when the wavelength is greater than the design wavelength.

As can be seen in FIG. 6a, the zero order contribution when the input wavelength is the design wavelength is still zero, since the phase shift of zero and $2\pi$ will look the same at the design wavelength. As shown in FIG. 6b, when the input wavelength is less than the design wavelength, there will be a third phasor vector arising from the presence of the $2\pi$ portions. The resultant vector 22 will have an amplitude of $\sin^4((\pi/2)(\lambda_0/\lambda - 1))$. Thus, the zero order contribution will be significantly reduced from that previously shown in FIG. 3b. Similarly, in FIG. 6c, the resultant vector 24 will have an amplitude of $\sin^4((\pi/2)(\lambda_0/\lambda - 1))$. For the range noted previously of $\lambda = 0.83 \lambda_0$ through $\lambda = 1.20 \lambda_0$, the zero order diffraction deficiency is reduced to less than 1%. Thus, the magnitude of the zero order contribution of the diffuser 20 for the non-design wavelengths is reduced by an order of magnitude compared with the diffuser 10.

Figure 1:
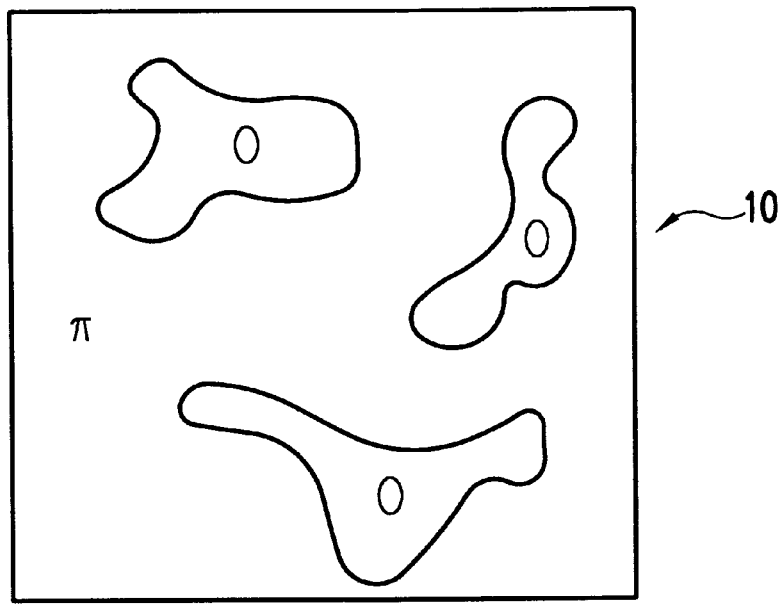
FIG. 1 is a schematic illustration of a related diffractive diffuser.
Figure 2:
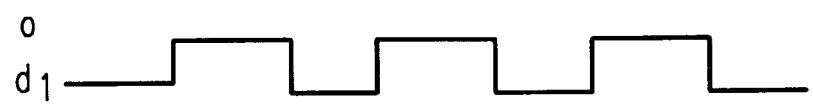
FIG. 2 illustrates the etch depth for the diffractive diffuser shown in FIG. 1.

The diffuser 20 of the present invention may advantageously be produced by generating two patterns for a diffuser as shown in FIG. 1 and then logically combining these patterns. More specifically, a first diffractive diffuser pattern is generated and a second diffractive diffuser pattern is generated and superimposed on the first pattern. The zero regions of the first generated pattern may then be subjected to, for example, an add operation with the second generated pattern to form the regions of zero and $2\pi$. For example, when adding the two patterns, when both regions are zero, that region will remain a zero region, when both regions are $\pi$ regions, that region will remain a $\pi$ region, but if the region is zero in one pattern and $\pi$ in the other pattern, that region will become a $2\pi$ region. Of course logical operations may be performed mathematically using functions describing the respective patterns.

As an example, a single pattern as shown in FIG. 1 is generated, and then this pattern is rotated by 90° and used as the second generated pattern. The single pattern is generated in accordance with a desired distribution over a desired region of a desired shape at the design wavelength. These two patterns are then added to form the pattern having the three phase regions distributed thereon.

Another method using two patterns involves adding the phases in corresponding regions in two binary patterns. In this method, where both patterns are 0, the final pattern has a phase of 0, when both are $\pi$, the final pattern has a phase of $2\pi$, and where one pattern is 0 and one is $\pi$, the final pattern has a phase of $\pi$. The final or resulting pattern in the input plane is the Fourier Transform pattern of the desired output. The addition of the phases in the input plane, which is the spatial domain, results in the convolution of the pattern in the output plane, which is the frequency domain. Thus, when adding the phases within two patterns, these patterns are designed to account for the fact that their respective outputs will be convolved.

For example, a first pattern may be generated in accordance with the desired output at the design wavelength, but having an output that is slightly smaller than the desired output. The second pattern is then generated to form a small spot in the output plane. When the phases of this second pattern are added to the phases of the first pattern, the resulting pattern has 0, π and 2π regions, and the resulting output is larger than the output of the first pattern, thereby forming the desired output. Thus, the first and second patterns are designed in relation to one another so that the second pattern increases the size, or blurs, the first pattern to form the desired output. In this example, the first pattern contains the high frequency information needed to generate the desired output, while the second pattern contains the low frequency information needed to generate the desired output.

An alternative manner of zero-order balancing the broadband diffuser 20 involves a fractal method of splitting the zero regions into regions of zero and 2π. A single diffuser pattern is generated, then searched to determine regions where the phase is zero. This search involves scanning every pixel in the pattern until a pixel with zero phase is encountered. Then every pixel in this zero phase region is traversed, e.g., in a four connected fashion, e.g., examining the top, bottom, left and right pixels adjacent to the current pixel. This traversal proceeds until every zero phase pixel that is contiguously connected to the region is encountered. Each such zero phase pixel is flagged with an identifier indicating that it is part of the connected region. The connected region is then traversed again from both sides, preferably starting with the first pixel and the last pixel encountered in the connected region. Pixels on either side are flagged with different identifiers until the region is divided approximately in half. One-half of the region is then set to have a phase of 2π and the other half is left having the zero phase. This process is repeated for each zero phase region in the original diffuser pattern.

The initial diffuser patterns are formed as set forth in U.S. patent application Ser. No. 08/770,584, in which a diffuser is to have a desired line width and the line widths are oriented randomly. These line widths determine the angular region of the diffused beam in the far field. The resulting computer generated pattern or hologram is a Fourier Transform pattern that corresponds to the desired angular region. The preferred method of generating such a pattern is using an iterative computer optimization technique, such as the IDO method described in *Iterative Encoding of High Efficiency Holograms for Generation of Spot Arrays*, Optics Letters, Vol. 14, pp. 479–81, 1989. The resulting or final hologram may be constructed in known manners, e.g., photolithographically, such as set forth in U.S. Pat. Nos. 4,895,790 and 5,202,775, which are hereby incorporated by reference in their entirety.

The three different methods set forth above for forming the diffractive diffuser in accordance with the present invention may result in a different final pattern for the broadband diffuser, but all the final patterns should have three levels and a phase difference approximately equal to π between at least two of the levels. Advantageously for the final patterns, approximately 50% of the surface presents a phase shift of π to the design wavelength, approximately 25% of the surface presents a phase shift of zero to the design wavelength, and the remaining 25% of the surface presents a phase shift of 2π to the design wavelength.

The invention being thus described, it will be obvious that the same may be varied in many ways. For example, the π regions may similarly be split into π regions and 3π regions, to reduce the resultant vector for non-design wavelengths. Such variations are not to be regarded as a departure from the spirit and scope of the invention, and all such modifications as would be obvious to one skilled in the art are intended to be included within the scope of the following claims.

What is claimed:

1. A method of designing a broadband diffractive diffuser comprising:

generating a first diffractive diffuser pattern at a design wavelength; and modifying the first diffractive diffuser pattern to provide light at a wavelength other than the design wavelength with more phasor vectors at zero order than light at the design wavelength, said modifying including generating a second diffractive diffuser pattern and adding phases of said second diffuser pattern to corresponding phases of said first diffractive diffuser pattern, wherein said first diffractive diffuser pattern forms an undersized desired output, said second diffractive diffuser pattern forms a spot, and a modified pattern formed by adding phases of said second diffractive diffuser pattern and said first diffractive diffuser pattern generates a desired output.

2. The method according to claim 1, wherein said modifying includes performing an operation between regions of said first diffractive diffuser pattern which present a zero phase shift and said second different diffractive diffuser pattern.

3. The method according to claim 2, wherein said generating said second diffractive diffuser pattern includes rotating said first diffractive diffuser pattern.

4. The method according to claim 2, wherein said operation is an add operation.

5. The method according to claim 1, wherein said generating includes iterative computer optimizing.

6. The method according to claim 1, wherein said generating includes splitting the diffuser into regions having a phase shift of π and regions having a phase shift of zero at the design wavelength, and said modifying includes splitting regions having a phase shift of zero into regions having a phase shift of zero and regions having a phase shift of 2π at the design wavelength.

7. The method according to claim 6, wherein at least one of said splittings is even.

8. The method according to claim 6, wherein at least one of said splittings results in amorphous regions.

9. The method according to claim 6, wherein said splittings include a pixel-by-pixel search.

10. The method according to claim 1, wherein said generating and modifying are performed on a computer to form a computer generated hologram.

11. The method according to claim 1, further comprising photolithographically creating a modified diffractive diffuser pattern output by said modifying.

* * * * *